United States Patent
Lee et al.

(10) Patent No.: US 10,942,405 B2
(45) Date of Patent: Mar. 9, 2021

(54) DISPLAY DEVICE

(71) Applicant: LG Display Co., Ltd., Seoul (KR)

(72) Inventors: Yongwon Lee, Seoul (KR); Byung Soo Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/566,110

(22) Filed: Sep. 10, 2019

(65) Prior Publication Data
US 2020/0081309 A1     Mar. 12, 2020

(30) Foreign Application Priority Data
Sep. 12, 2018   (KR) .................. 10-2018-0108800

(51) Int. Cl.
| G02F 1/1362 | (2006.01) |
| G09G 3/36 | (2006.01) |
| H01L 27/32 | (2006.01) |

(52) U.S. Cl.
CPC ..... *G02F 1/136286* (2013.01); *G09G 3/3607* (2013.01); *G09G 3/3614* (2013.01); *H01L 27/3213* (2013.01); *H01L 27/3248* (2013.01); *H01L 27/3262* (2013.01); *H01L 27/3276* (2013.01); *G02F 2001/13629* (2013.01)

(58) Field of Classification Search
CPC ............ H01L 27/3262; H01L 27/3276; H01L 27/3213; H01L 27/3248; G02F 1/136286; G02F 2001/13629; G09G 3/3607; G09G 2300/0426; G09G 2300/0452; G09G 2310/08; G09G 2300/0469; G09G 2300/0417; G09G 3/3614; G09G 2300/0495
See application file for complete search history.

(56) References Cited

U.S. PATENT DOCUMENTS

| 2010/0156947 A1* | 6/2010 | Moon .................. G09G 3/3648 345/690 |
| 2014/0125644 A1* | 5/2014 | Guo ..................... G09G 3/3648 345/209 |
| 2014/0204008 A1* | 7/2014 | Chu-Ke .............. G09G 3/2003 345/88 |
| 2014/0217411 A1* | 8/2014 | Jiang ................. G02F 1/136286 257/59 |
| 2017/0061844 A1* | 3/2017 | Wang ................... G09G 3/2003 |
| 2017/0322446 A1* | 11/2017 | Tae ................... G02F 1/134309 |
| 2018/0357970 A1* | 12/2018 | Bae ...................... G09G 3/3607 |

* cited by examiner

*Primary Examiner* — Muhammad N Edun
(74) *Attorney, Agent, or Firm* — Morgan, Lewis & Bockius LLP

(57) ABSTRACT

Disclosed is a display device having a QRD-based rendering structure capable of achieving the same performance as a display device using a conventional DRD scheme while performing a horizontal 2-dots inversion. Further, disclosed is a QRD-based display device with a new rendering structure to achieve a performance equivalent to that of an existing DRD scheme.

17 Claims, 10 Drawing Sheets

DISPLAY DEVICE

CROSS-REFERENCE TO RELATED APPLICATIONS

This application claims the priority of Korean Patent Application No. 10-2018-0108800 filed on Sep. 12, 2018, in the Korean Intellectual Property Office, the disclosure of which is hereby incorporated by reference in its entirety.

BACKGROUND

Technical Field

The present disclosure relates to a display device. More particularly, the present disclosure relates to a display device using a Quad Rate Driving (QRD) scheme with an improved aperture ratio and with a lowered driving power consumption.

Description of the Related Art

Flat-panel display devices (FPDs) are used in a wide variety of electronic products, including mobile phones, tablet PCs, and notebooks. Flat display devices include a liquid crystal display device (LCD), a plasma display panel (PDP), and an organic light emitting display device (OLED). Recently, an electrophoretic display device (EPD) is widely used.

Among the flat display devices (hereinafter simply referred to as 'display devices'), the liquid crystal display device (LCD) displays video using optical anisotropy of a liquid crystal. The LCD is widely used because of advantages such as thinness, a small size, a low power consumption and a high image quality thereof.

In general, the liquid crystal display devices display video using electrical and optical properties of liquid crystals. The liquid crystals have anisotropic properties in terms of a refractive index and a dielectric constant depending on the LC molecular long axial direction and the LC molecular short axial direction. The molecular arrangement and thus the optical properties thereof can be easily controlled. Thus, the liquid crystal display device displays video by varying the alignment direction of the liquid crystal molecules according to an electric field intensity and thus adjusting light transmittance through a polarizing plate.

The liquid crystal display device includes a liquid crystal panel in which a plurality of pixels are arranged in a matrix form, a gate driver for driving a gate line of the liquid crystal panel, and a data driver for driving a data line of the liquid crystal panel.

In such a liquid crystal display device, in order to reduce a DC offset component and reduce deterioration of the liquid crystal, an inversion driving scheme has been applied in which polarities are opposite between neighboring liquid crystal cells and the polarity is inversed on a frame basis.

Further, Double Rate Driving (hereinafter simply referred to as DRD) scheme is used to reduce the number of data drivers of the display device or the number of the data line DLs thereof.

In a display device using the DRD scheme, the number of horizontal gate lines is doubled but the number of data lines is reduced by half compared to that in a display device without the DRD scheme. That is, the DRD scheme may implement the same resolution while reducing the number of data drivers or the number of data lines required by half.

The display device using the DRD scheme uses a two-dot inversion scheme. However, the display device using the two-dot inversion scheme requires a large amount of power, and has a vertical line DIM.

To overcome those problems, various kinds of Z-inversion schemes and structures using the DRD scheme are being developed.

Recently, a Quad Rate Driving scheme (hereinafter simply referred to as DRD scheme) has been developed to reduce the number of D-ICs or the number of data lines DL in the data driver of the display device. The QRD-based display device has the advantage that the number of data lines may be reduced to ¼ of that of the conventional display device. However, a QRD-based rendering structure that provides equivalent performance to the display device using the DRD scheme has not been proposed.

SUMMARY

Accordingly, embodiments of the present disclosure are directed to a display device that substantially obviates one or more of the problems due to limitations and disadvantages of the related art.

An aspect of the present disclosure is to provide a QRD-based rendering structure as described above capable of achieving the same performance as the display device using the conventional DRD scheme while performing a horizontal 2-dots inversion. That is, the present disclosure aims to provide a QRD-based display device with a new rendering structure to achieve the performance equivalent to that of the existing DRD scheme.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device may comprise a plurality of sub-pixels arranged in a pixel row, the sub-pixels rendering R, G, B, and/or W colors; a plurality of gate lines, each gate line extending in an alternated and staggered manner between tops and bottoms of the sub-pixels; a plurality of data lines extending to intersect the gate lines; and a plurality of thin-film transistors, each transistor connecting each of the gate lines and each of the data lines to each sub-pixel, wherein four sub-pixels are activated via a single data line and four gate lines.

The display device according to the present disclosure having the features as described below may have effects such as the following examples. However, the present disclosure is not limited thereto.

First, it may be possible to operate four sub-pixels using a single data line, so that the number of data lines can be reduced to improve the aperture ratio. As a result, the number of data channels as required can be reduced, which reduces the number of D-ICs in the data driver, thereby lowering a production cost.

Second, according to the present disclosure, an oxide thin film transistor having excellent mobility compared to an amorphous-silicon thin film transistor (a-Si TFT) may be applied. Thus, even when the charging time is reduced to ¼ of that of the conventional device, the same image quality as the conventional device can be realized without lowering the resolution.

Third, when the data signal has the polarity based on the column inversion scheme, the color may be rendered based on the horizontal 2-dots inversion scheme, thereby reducing the power consumption.

Further specific effects of the present disclosure as well as the effects as described above will be described in conduction with illustrations of specific details for carrying out the present disclosure.

It is to be understood that both the foregoing general description and the following detailed description are exemplary and explanatory and are intended to provide further explanation of the inventive concepts as claimed.

BRIEF DESCRIPTION OF DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
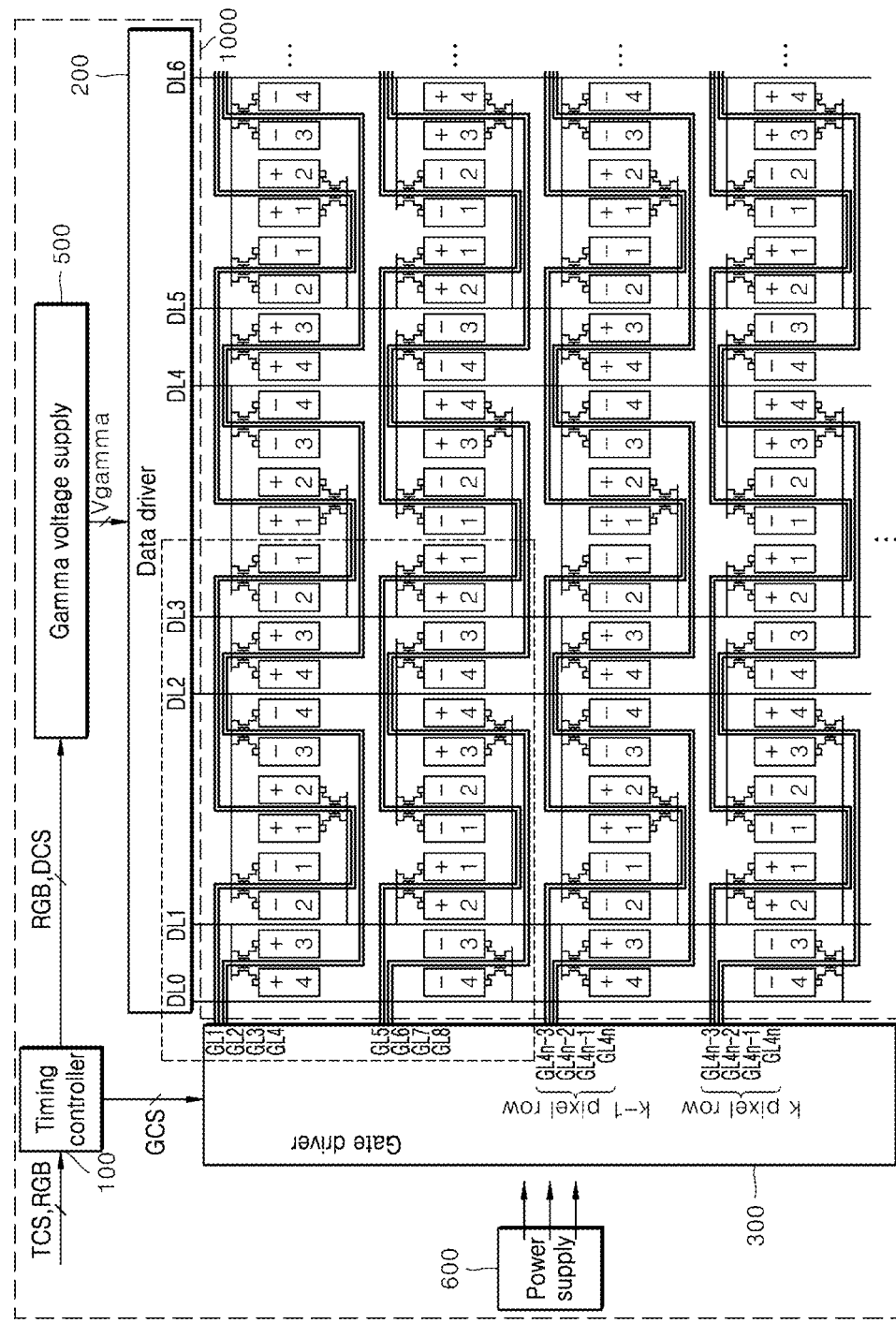
FIG. 1 shows a configuration of a QRD-based and Z-inversion-based display device according to an embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, example embodiments of the present disclosure will be described with reference to the accompanying drawings. Throughout the drawings, like reference numerals refer to like elements.

Hereinafter, display devices according to various embodiments of the present disclosure will be illustrated.

FIG. 1 shows a configuration of a QRD Z-inversion-based display device according to an embodiment of the present disclosure.

Figure 2:
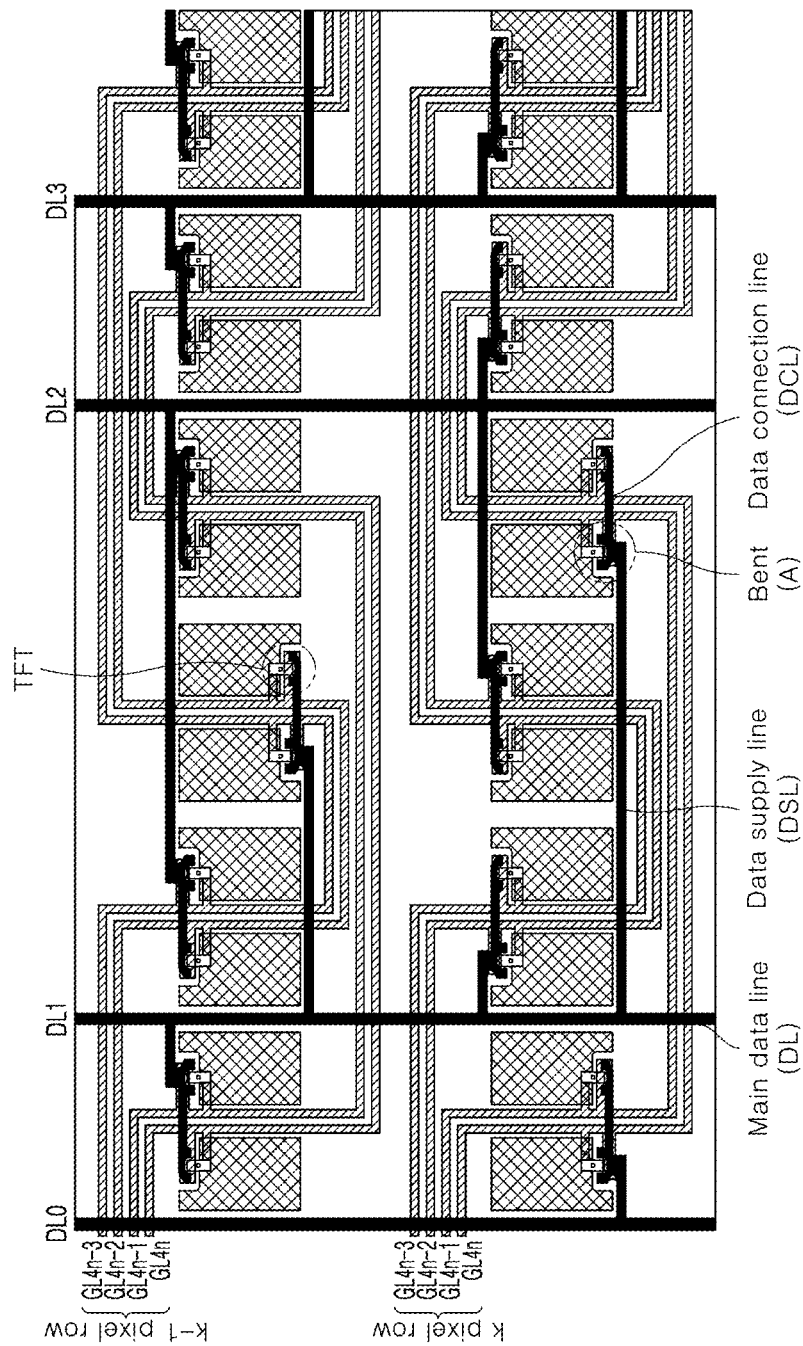
FIG. 2 shows an enlarged representation of a portion of a pixel as shown in FIG. 1.

FIG. 2 shows an enlarged representation of a portion of a pixel shown in FIG. 1.

As shown in FIG. 1 and FIG. 2, the QRD Z-inversion-based display device according to the embodiment of the present disclosure includes a display panel 400 having a pixel matrix defined by a number of gate lines GL1 to GLn and data lines DL0, DL2m−1 to DL2m intersecting with each other; a data driver 200 for supplying a video signal to the data lines DL1 to DLm of the display panel 400; a gate driver 300 for driving the gate lines GL1 to GLn of the display panel 400; and a timing controller 100 for aligning video data RGB from an outside and supplying the aligned video data RGB to the data driver 200 and simultaneously for generating a data control signal DCS and controlling the data driver 200 using the control signal.

A driving circuitry 1000 may include the timing controller 100, the data driver 200, the gate driver 300, a gamma voltage supply 500, and a power supply 600.

In this connection, the timing controller 100 receives a video signal RGB, and a control signal TCS such as a vertical synchronization signal, a horizontal synchronization signal, a main clock signal and a data enable signal from an external system such as a TV system or a video card. In one example, although not shown, such signals may be input into the controller 100 via an interface disposed within the timing controller 100.

The timing controller 100 generates the data control signal DCS for controlling the data driver 200 using the input control signal TCS.

The data control signal DCS may include a Source Start Signal SSS, a Source Sampling Clock SSC, a Source Output Enable SOE, and a Polarity POL.

Further, the timing controller 100 receives the video data RGB from an external system, aligns the video data, and transmits the aligned video data to the data driver 200.

Further, in response to the input control signal TCS, the timing controller 100 generates a gate control signal GCS for controlling the gate driver 300. The gate control signal GCS includes a gate start signal VST, an on-clock pulse on-CLK, an off-clock pulse off-CLK, gate signals G1 to Gn, and the like.

The data driver 200 supplies a data voltage to the plurality of data lines DL1 to DLm in response to the data control signal DCS and the video data RGB supplied from the timing controller 100. That is, the data driver generates a data voltage corresponding to the video data RGB using a gamma voltage Vgamma. The data driver supplies the generated data voltage to corresponding data lines DL1 to DLm.

The power supply 600 generates various driving voltages required to drive the display device. For example, the power supply 600 generates a power voltage supplied to the timing controller 100, the data driver 200 and the gate driver 300, and a gate high voltage Vgh and a gate low voltage Vgl supplied to the gate driver 300.

The gate driver 300 sequentially selects a plurality of gate lines GL1 to GLn in response to the gate control signal GCS supplied from the timing controller 100. Then, the gate driver 300 outputs a turn-on voltage, for example, a gate high voltage Vgh to the selected gate lines GL1 to GLn. The gate high voltage Vgh may enable each thin film transistor TFT connected to each of the gate lines GL1 to GLn to be turned on.

Then, until a next frame is selected, the gate lines GL1 to GLn is supplied with a turn-off voltage, for example, a gate low voltage Vgl. As a result, each thin film transistor TFT is kept in a turned off state.

The display panel 400 includes a plurality of mutually intersecting gate lines GL1 to GLn and data lines DL1 to DLm, a plurality of sub-pixels R, G, and B, and thin film transistors TFTs connected to the gate lines GL1 to GLn and data lines DL1 to DLm respectively.

A specific configuration of the display panel 400 is as follows.

In the display panel according to one embodiment of the present disclosure, a $(4n-3)$-th gate line GL$4n-3$ and a $(4n-2)$-th gate line GL$4n-2$ extend parallel to each other and define a pair. Further, a $(4n-1)$-th gate line GL$4n-1$ and a $4n$-th gate line GL$4n$ extend parallel to each other and define a pair.

The $(4n-3)$-th gate line GL$4n-3$ and $(4n-2)$-th gate line GL$4n-2$ extend above and along tops of leftmost three sub-pixels, that is, a first sub-pixel to a third sub-pixel, and then is bent downwardly to pass through between the third sub-pixel and a fourth sub-pixel, and, then, extend below and along bottoms of adjacent two sub-pixels, that is, the fourth sub-pixel to a fifth sub-pixel, and, then, is bent upwardly to pass through between the fifth sub-pixel and a sixth sub-pixel, and, then, extend above and along tops of adjacent six sub-pixels, that is, the sixth sub-pixel to 11-th sub-pixel, and, then, then is bent downwardly to pass through between the 11-th sub-pixel and a 12-th sub-pixel and then extend below and along a bottom of the 12-th pixel. This extension pattern in which the $(4n-3)$-th gate line GL$4n-3$ and $(4n-2)$-th gate line GL$4n-2$ extend above and along tops of the six sub-pixels, and then extend below and along bottoms of the two sub-pixels may be repeated up to a last sub-pixel.

The $(4n-1)$-th gate line GL$4n-1$ and $4n$-th gate line GL$4n$ extend above and along a top of the leftmost one sub-pixel, that is, the first sub-pixel, and then is bent downwardly to pass through between the first sub-pixel and the second sub-pixel, and, then, extend below and along bottoms of adjacent six sub-pixels, that is, the second sub-pixel to the seventh sub-pixel, and, then, is bent upwardly to pass through between the seventh sub-pixel and the eighth sub-pixel, and, then, extend above and along tops of adjacent two sub-pixels, that is, the eighth sub-pixel to ninth sub-pixel, and, then, then is bent downwardly to pass through between the ninth sub-pixel and the tenth sub-pixel and then extend below and along the bottom of the 10-th to 12-th sub-pixels. This extension pattern in which the $(4n-1)$-th gate line GL$4n-1$ and $4n$-th gate line GL$4n$ extend below and along the bottoms of the six sub-pixels, and then extend above and along the top of the two sub-pixels may be repeated up to the last sub-pixel.

In other words, the multiple gate lines may be configured such that the $(4n-3)$-th gate line GL$4n-3$ and the $(4n-2)$-th gate line GL$4n-2$ extend parallel to each other and define a pair; the $(4n-1)$-th gate line GL$4n-1$ and the $4n$-th gate line GL$4n$ extend parallel to each other and define a pair; the $(4n-3)$-th gate line GL$4n-3$ and $(4n-2)$-th gate line GL$4n-2$ extend above and along tops of the six sub-pixels, and then extend below and along bottoms of the two sub-pixels; the $(4n-1)$-th gate line GL$4n-1$ and $4n$-th gate line GL$4n$ extend below and along the bottoms of the six sub-pixels, and then extend above and along the top of the two sub-pixels. That is, the $(4n-3)$-th gate line GL$4n-3$ and the $(4n-2)$-th gate line GL$4n-2$ extend above and along tops of the leftmost one sub-pixel or three sub-pixels and then extend in an alternated and zig-zag manner between the tops and bottoms of the consecutive two or six sub-pixels. The $(4n-1)$-th gate line GL$4n-1$ and $4n$-th gate line GL$4n$ extend above and along tops of the leftmost one sub-pixel or three sub-pixels and then extend in an alternated and zig-zag manner between the tops and bottoms of the consecutive two or six sub-pixels.

Further, the $(4n-3)$-th gate line GL$4n-3$ is connected to a $4j$-th sub-pixel and a $(4j+1)$-th sub-pixel. The $(4n-2)$-th gate line GL$4n-2$ is connected to a $(4j-1)$-th sub-pixel and a $(4j+2)$-th sub-pixel. The $(4n-1)$-th gate line GL$4n-1$ is connected to a $(4j-2)$-th sub-pixel and a $(4j+3)$-th sub-pixel. The $4n$-th gate line GL$4n$ is connected to a $(4j-3)$-th sub-pixel and a $(4j+4)$-th sub-pixel.

In the display panel 400, all of the $(4n-3)$-th gate line GL$4n-3$ to $4n$-th gate line GL$4n$ may be repeated in the same manner in each of a (k−1)-th pixel row and a k-th pixel row.

However, the present disclose is not limited thereto. Various modifications to the QRD-based gate line structure implementing the horizontal 2-dot inversion will be possible to the person skilled to the art as long as the modifications do not deviate from the technical idea of the present disclosure.

Further, a plurality of data lines DL0, DL$2m-1$ to DL$2m$ extend in a perpendicular direction to the plurality of gate lines GL1 to GLn while passing between adjacent sub-pixels.

The $(2m-1)$-th data line DL$2m-1$ and 2m-th data line DL$2m$ except for a leftmost data line DL0 extend to define a pair.

In this connection, the $(2m-1)$-th data line DL$2m-1$ and 2m-th data line DL$2m$ are spaced apart by 6 sub-pixels. The pair of $(2m-1)$-th data line DL$2m-1$ and 2m-th data line DL$2m$ are then spaced apart by a next pair thereof by two sub-pixels. Then, this configuration is repeated to the last sub-pixel.

Specifically, the leftmost data line DL0 is located at the left end of the display panel 400 and is adjacent to the leftmost sub-pixel.

The first data line DL1 is spaced apart from the leftmost data line DL0 by two sub-pixels, while extending between the second sub-pixel and the third sub-pixel. The second data line DL2 is spaced apart from the first data line DL1 by six sub-pixels and extends between the eighth sub-pixel and the ninth sub-pixel.

Again, the third data line DL3 is spaced apart from the second data line DL2 by two sub-pixels, while extending between the tenth sub-pixel and the eleventh sub-pixel. The fourth data line DL4 is spaced apart from the third data line DL3 by 6 sub-pixels, and extends between the 16th sub-pixel and the 17th sub-pixel.

In other words, the leftmost data line DL0 is not connected to the sub-pixel in the (k−1)-th pixel row, and is connected to a $(4j-3)$-th sub-pixel and a $(4j-2)$-th sub-pixel of the k-th pixel row.

The $(2m-1)$-th data line DL$2m-1$ is connected to a $(4j-3)$-th sub-pixel and a $(4j-2)$-th sub-pixel and a $(4j+1)$-th sub-pixel and a $(4j+2)$-th sub-pixel in the (k−1)-th pixel row, and is connected to a $(4j-1)$-th sub-pixel and a $4j$-th sub-pixel, and a $(4j+3)$-th sub-pixel and a $(4j+4)$-th sub-pixel in the k-th pixel row.

The 2m-th data line DL$2m$ is connected to a $(4j-1)$-th sub-pixel and a $4j$-th sub-pixel and a $(4j+3)$-th sub-pixel and a $(4j+4)$-th sub-pixel in the (k−1)-th pixel row, and is connected to a (4j+1)-th sub-pixel and a (4j+2)-th sub-pixel and a ((4j+1)−3)-the sub-pixel and a ((4 j+1)−2)-Th Sub-Pixel in the k-Th Pixel Row.

In this connection, j is an odd number, and k is an even number, n and m are natural numbers. Further, the sub-pixel may be an R, G, or B sub-pixel R, G, or B rendering red, green, and blue respectively. R, G, and B sub-pixels R, G, and B adjacent to each other in the horizontal direction define a pixel P, which is a unit of video display.

The (4n−3)-th to 4n gate lines are repeated in all pixel rows in the same manner and are connected to the R, G, and B sub-pixels R, G, and B that are sequentially and repeatedly arranged in every pixel row.

Further, each of the multiple gate lines and multiple data lines is connected to each sub-pixel via each thin film transistor.

However, the present disclose is not limited thereto. Various modifications to the QRD-based data line structure implementing the horizontal 2-dot inversion will be possible to the person skilled to the art as long as the modifications do not deviate from the technical idea of the present disclosure.

FIG. 2 shows an enlarged layout of an area indicated by the dotted line in FIG. 1. As shown in FIG. 2, the data line DL is further subdivided such that the data line DL may be divided into a main data line DL and a data supply line DSL and a data connection line DCL.

The main data line DL is connected to the data driver and passes between sub-pixels.

The data supply line DSL branches from the main data line DL toward a sub-pixel to which data is to be applied. The data supply line DSL may branch from the main data line DL in one direction or in both directions.

The data connection line DCL receives the data signal from the data supply line DSL and applies the same to the sub-pixel. The data connection line DCL has a U-shape and is connected to each thin film transistor TFT.

The thin film transistor TFT includes a gate electrode made of a first metal and a source and drain electrode made of a second metal.

The first metal and the second metal may be the same material.

The data supply line DSL and the data connection line DCL are connected to each other via a bent portion A not without overlapping each other. This is to ensure that the sub-pixels have the same area.

Further, when the data connection line DCL is connected to a corresponding sub-pixel via a thin film transistor TFT, the data connection line is connected to the top or bottom of the DCL sub-pixel. A shape of the corresponding sub-pixel may be inverted according to the connection position, that is, the bottom or top. It is most preferred that the number of inverted shaped sub-pixels is equal to the number of non-inverted shaped sub-pixels.

When a plurality of gate lines GL1 to GLn and a plurality of data lines DL0 and DL2m−1 to DL2m are formed in the above-described manner, no gate line GL extends between a 2a-th sub-pixel and a (2a+1)-th sub-pixel. Further, no data line DL extends between a (b−7)-th sub-pixel and a (b−6)-th sub-pixel and between a (b−5)-th sub-pixel and a b-th sub-pixel. Therefore, no gate line GL or data line DL is formed between a (c−4)-th sub-pixel and a (c−3)-th sub-pixel and between a (c−2)-th sub-pixel and a (c−1)-th sub-pixel. Thus, an effect of improving the aperture ratio can be obtained in accordance with the present disclosure compared with a conventional structure in which each data line is formed between every adjacent sub-pixels. In this con-nection, a is a natural number, b and c are multiples of 8.

Further, since a plurality of gate lines GL1 to GLn and a plurality of data lines DL1 to DLm are formed on different layers, a common voltage line (not shown) for supplying a common voltage may be additionally arranged in a region between sub-pixels where no data line DL is formed. Thereby, the image quality can be more improved. Further, for a display device including a touch function, an auxiliary touch line (not shown) may be formed to improve performance.

For a display device including a touch function, a touch electrode (not shown) may be formed on the sub-pixel. The touch electrode is connected via the touch line to the sub-pixel. The touch line may be formed in a region between sub-pixels where the data line DL is not formed.

Further, the touch line may be made of a third metal different from the first metal of the gate electrode of the thin film transistor TFT and the second metal of the source/drain electrode of the TFT. The touch line made of the third metal acts as a touch detection line during touch operation and act as a common voltage line during display operation.

Further, in addition to the scheme in which the touch line is formed in the panel as described above, a separate touch panel may be formed.

However, the present disclose is not limited thereto. Various modifications to the QRD-based pixel structure implementing the horizontal 2-dot inversion will be possible to the person skilled to the art as long as the modifications do not deviate from the technical idea of the present disclosure.

Figure 3A:
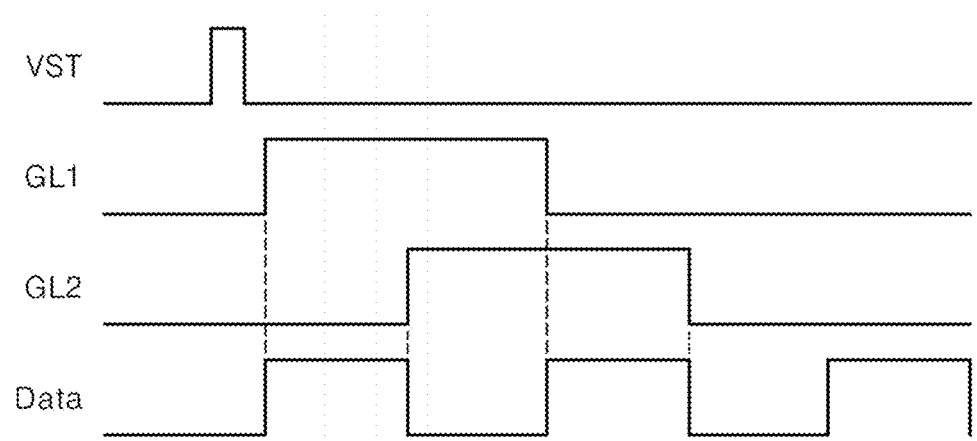
FIG. 3a shows a comparison between waveforms of a data signal and a gate signal of a display device using a normal driving scheme of a related art.

FIG. 3a shows a comparison between waveforms of a data signal and a gate signal of a display device using a normal driving scheme of a related art.

Figure 3B:
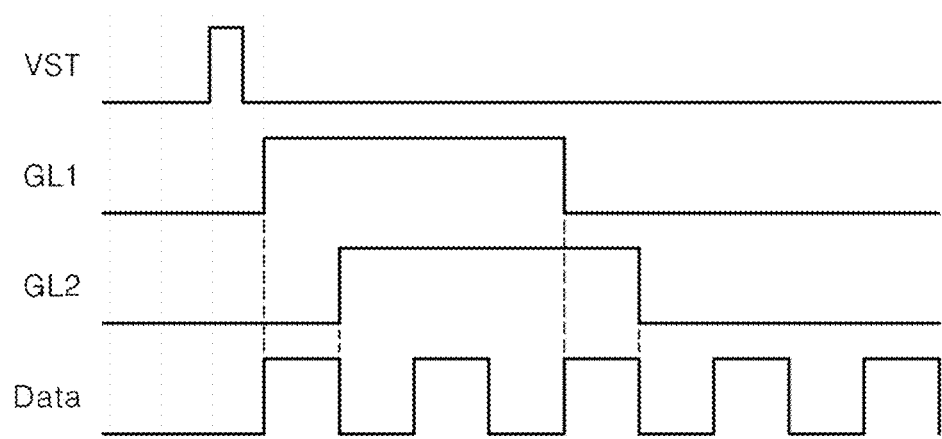
FIG. 3b shows a comparison between waveforms of a data signal and a gate signal of a display device using a DRD driving scheme of a related art.

FIG. 3b shows a comparison between waveforms of a data signal and a gate signal of a display device using a DRD driving scheme of a related art.

Figure 3C:
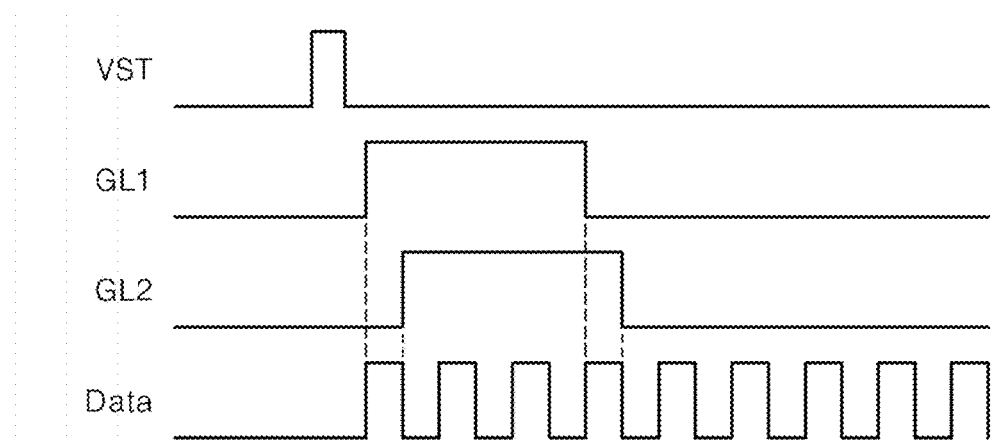
FIG. 3c shows a simplified example of data signal and gate signal waveforms of a display device using a QRD driving scheme according to the present disclosure.

FIG. 3c shows a simplified example of data signal and gate signal waveforms of a display device using a QRD driving scheme according to the present disclosure.

FIG. 3a to FIG. 3c show that the DRD driving scheme has a pixel charge time of ½ of that of a normal driving scheme of a related art, and the QRD driving scheme has a pixel charge time of ¼ of that of a normal driving scheme of a related art. In a conventional display panel using an a-Si TFT, the DRD driving scheme has a pixel charging time of ½ of that of the normal driving scheme, so that the charging time is somewhat reduced, while the normal operation is realized.

However, in a display panel using an a-Si TFT, when the QRD driving scheme is applied while the same resolution as the conventional resolution is maintained without changing the resolution, the normal operation is impossible because the charging time of the pixel becomes insufficient.

According to the present disclosure, an oxide thin film transistor (oxide TFT) instead of a-Si TFT is applied to the display device using the QRD driving scheme, such that the normal operation is possible while maintaining the same resolution as the conventional one.

Further, since the oxide thin film transistor (oxide TFT) is applied, the mobility is improved as compared with the application of the a-Si TFT. Thus, the width of the gate line may be reduced compared with the conventional one. Thus, even when the number of gate lines increases as compared to the conventional normal driving scheme or DRD driving scheme, a gap between the upper and lower sub-pixels due to the gate line is not excessively increased but is maintained at the same level as the conventional one. Thus, in the display device using the QRD driving scheme in accordance with the present disclosure, the number of gate lines is doubled or quadrupled compared to that of the normal driving scheme or the DRD driving scheme, the number of data lines is reduced to ½ or ¼ of that of the normal driving scheme or the DRD driving scheme. Further, the width of the gate line is reduced compared to that of the normal driving scheme or the DRD driving scheme. Thus, the effect of improving the aperture ratio can be obtained.

Figure 4:
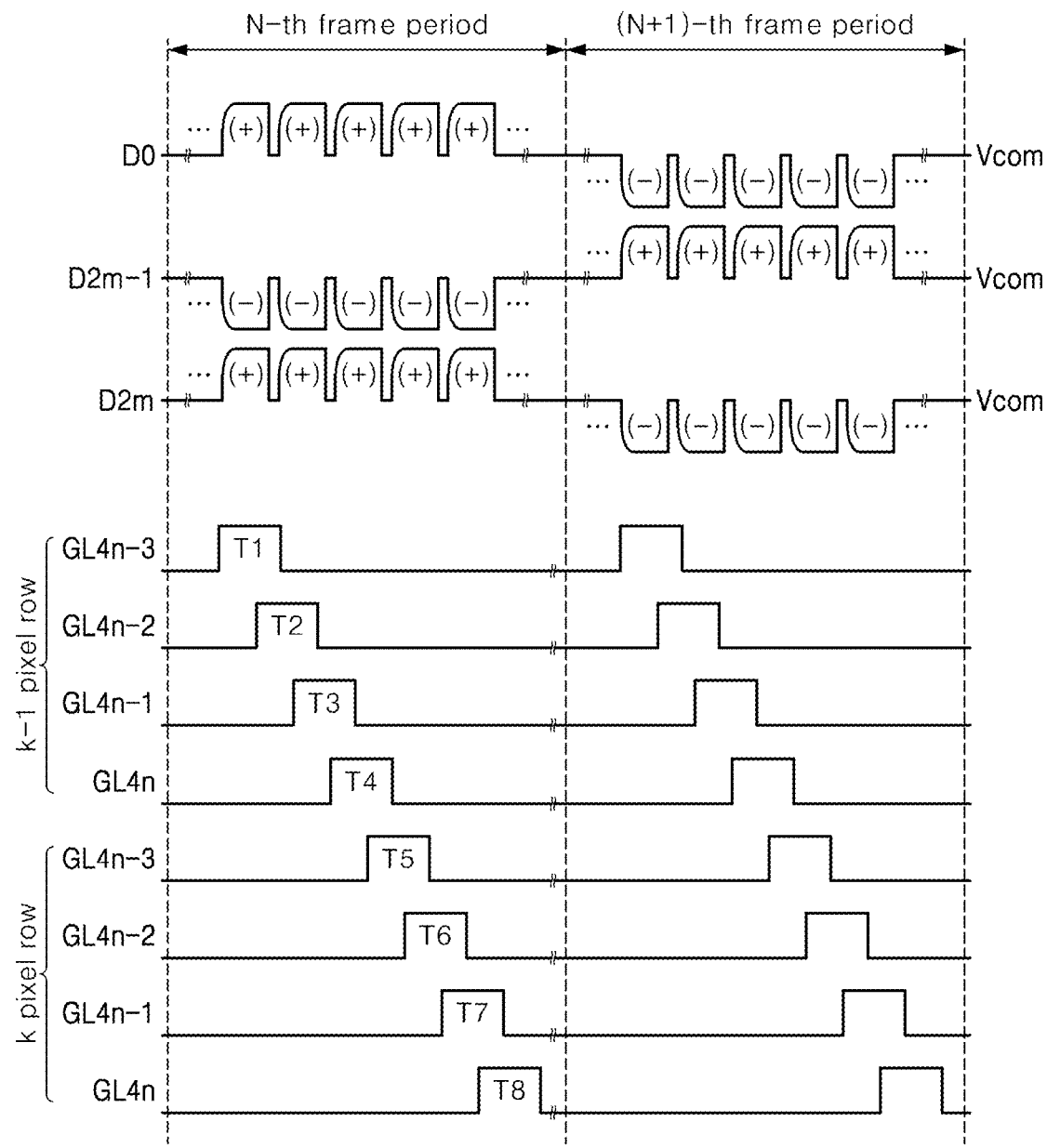
FIG. 4 shows a waveform diagram of outputs of a data driver and a gate driver according to an embodiment of the present disclosure.

FIG. 4 is a waveform diagram of outputs of the data driver 200 and the gate driver 300 according to an embodiment of the present disclosure.

Referring to FIG. 4, the data signals D0, D2$m$−1, and D2$m$ output from the data driver 200 during each of a N-th (N is a natural number) frame period and a (N+1)-th frame period are shown. Each of gate signals output from the gate driver 300 is applied to each of the gate lines G1, G2, G3, ... G4$n$−1, and G4$n$ during each of a N-th (N is a natural number) frame period and a (N+1)-th frame period.

D0 represents the leftmost data signals supplied to the leftmost data line DL0. D1 represents the first data signals supplied to the first data line DL1. D2 represents the second data signals supplied to the second data line DL2. D2$m$−1 represents (2$m$−1)-th data signals supplied to (2$m$−1)-th data line DL2$m$−1. D2$m$ refer to the 2m-th data signals supplied to the m-th data line DL2$m$.

G1 denotes a first gate signal supplied to the first gate line GL1. G2 denotes a second gate signal supplied to the second gate line GL2. G3 is the third gate signal supplied to the third gate line GL3. Gn−1 means a (n−1)-th gate signal supplied to (n−1)-th gate line GLn−1. Gn refers to a n-th gate signal supplied to the n-th gate line GLn.

The data driver 200 supplies data voltages to the data lines based on a column inversion scheme. In the column inversion scheme, data voltages of opposite polarities are supplied to neighboring data lines respectively. The polarity of the data signal supplied to each of the data lines remains unchanged for one frame period. For example, during the n-th frame period, the data driver 200 supplies the leftmost data signals D0 at a first polarity, supplies the first data signals D1 at a second polarity, supplies the second data signals D2 at a first polarity, supplies (2$m$−1)-th data signals D2$m$−1 at the second polarity, and supplies the 2m-th data signals D2$m$ at the first polarity.

Further, for the (n+1)-th frame period, the data driver 200 supplies the leftmost data signals D0 at the second polarity, supplies the first data signals D1 at the first polarity, the second data supplies signals D2 at a second polarity, supplies (2$m$−1)-th data signals D2$m$−1 at a first polarity and supplies the 2m-th data signals D2$m$ at a second polarity. In FIG. 4, the first polarity represents positive polarity, while the second polarity represents negative polarity. It should be noted that the present disclosure is not limited thereto. That is, the first polarity may be a negative polarity and the second polarity may be a positive polarity.

The gate driver 300 sequentially outputs the gate signals to the gate lines. For example, for each of the n-th and (n+1)-th frame periods, the gate driver 300 outputs a first gate signal G1 to the first gate line G1, a second gate signal G2 to the second gate line G2, outputs a third gate signal G3 to the third gate line G3, outputs a (n−1)-th gate signal Gn−1 to the (n−1)-th gate line Gn−1, and outputs an n-th gate signal Gn to the n-th gate line Gn. Each of the gate signals has a gate high voltage VGH for a predetermined period. The predetermined period may be implemented as 3 to 7 horizontal periods. One horizontal period 1H means one line scanning time in which digital video data is written to the pixels of one horizontal line on the display panel 400.

Hereinafter, referring to FIGS. 1 to 4, a method of supplying a data voltage to sub-pixels during first to eighth durations (t1 to t8) of the n-th frame period will be described in detail.

The first duration t1 is the duration for which the (4$n$−3)-th gate signal G4$n$−3 is supplied to the (4$n$−3)-th gate line GL4$n$−3 of the (k−1)-th pixel row. The second duration t2 is the duration for which the (4$n$−2)-th gate signal G4$n$−2 is supplied to the (4$n$−2)-th gate line GL4$n$−2 of the (k−1)-th pixel row. The third duration t3 is the duration for which the (4$n$−1)-th gate signal G4$n$−1 is supplied to the (4$n$−1)-th gate line GL4$n$−1 of the (k−1)-th pixel row. The fourth duration t4 is the duration for which the 4$n$-th gate signal G4$n$ is supplied to the 4$n$-th gate line GL4$n$ of the (k−1)-th pixel row.

The fifth duration t5 is the duration for which (4$n$−3)-th gate signal G4$n$−3 is supplied to the (4$n$−3)-th gate line GL4$n$−3 of the k-th pixel row. The sixth duration t6 is the duration for which the (4$n$−2)-th gate signal G4$n$−2 is supplied to the (4$n$−2)-th gate line GL4$n$−2 of the k-th pixel row. The seventh duration t7 is the duration for which the (4$n$−1)-th gate signal G4$n$−1 is supplied to the (4$n$−1)-th gate line GL4$n$−1 of the k-th pixel row. The eighth duration t8 is the duration for which the 4$n$-th gate signal G4$n$ is supplied to the 4$n$-th gate line GL4$n$ of the k-th pixel row.

During the first duration t1, the 4$j$-th sub-pixel and (4$j$+1)-th sub-pixel connected to the (4$n$−3)-th gate line GL4$n$−3 of the (k−1)-th pixel row is charged with the data voltage corresponding to the (4$n$−3)-th gate signal G4$n$−3. The (4$m$+1)-th sub-pixel of the (k−1)-th pixel row connected to the (2$m$−1)-th data line DL2$m$−1 is charged according to the (2$m$−1)-th data signal D2$m$−1 of the second polarity. The 4$j$-th sub-pixel of the (k−1)-th pixel row connected to the 2m-th data line DL2$m$ is charged according to the 2m-th data signal D2$m$ of the first polarity.

During the second duration t2, the (4$j$−1)-th sub-pixel and (4$j$+2)-th sub-pixel connected to the (4$n$−2)-th gate line GL4$n$−2 of the (k−1)-th pixel row is charged with the data voltage corresponding to the (4$n$−2)-th gate signal G4$n$−2. The (4$j$+2)-th sub-pixel of the (k−1)-th pixel row connected to the (2$m$−1)-th data line is charged according to the (2$m$−1)-th data signal D2$m$−1 of the second polarity. The (4$j$−1)-th sub-pixel of the (k−1)-th pixel row connected to the 2m-th data line DL2$m$ is charged according to the 2m-th data signal D2$m$ of the first polarity.

During the third duration t3, the (4$j$−2)-th sub-pixel and (4$j$+3)-th sub-pixel connected to the (4$n$−1)-th gate line GL4$n$−1 of the (k−1)-th gate signal is charged to the data voltage corresponding to the (4$n$−1)-th gate signal G4$n$−1. The (4$j$−2)-th sub-pixel of the (k−1)-th pixel row connected to the (2$m$−1)-th data line DL2$m$−1 is charged according to the (2$m$−1)-th data signal D2$m$−1 of the second polarity. The (4$j$+3)-th sub-pixel of the (k−1)-th pixel row connected to the 2m-th data line DL2$m$ is charged according to the 2m-th data signal D2$m$ of the first polarity.

During the fourth duration t4, the (4$j$−3)-th sub-pixel and (4$j$+4)-th sub-pixel connected to the 4$n$-th gate line GL4$n$ of the (k−1)-th pixel row is charged with data voltage corresponding to the 4$n$-th gate signal G4$n$. The (4$j$−3)-th sub-pixel of the (k−1)-th pixel row connected to the (2$m$−1)-th data line DL2$m$−1 is charged according to the (2$m$−1)-th data signal D2$m$−1 of the second polarity. The (4$j$+4) th sub-pixel of the (k−1)-th pixel row connected to the 2m-th data line DL2$m$ is charged according to the 2m-th data signal D2$m$ of the first polarity.

During the fifth duration t5, the 4j-th sub-pixel and (4j+1)th sub-pixel connected to the (4n−3)-th gate line GL4n−3 of the k-th pixel row are discharged with the data voltage corresponding to the (4n−3)-th gate signal G4n−3. The (4j+1)th sub-pixel of the k-th pixel row connected to the (2m−1)-th data line DL2m−1 is charged according to the (2m−1)-th data signal D2m−1 of the second polarity. The 4j-th sub-pixel of the k-th pixel row connected to the 2m-th data line DL2m is charged according to the 2m-th data signal D2m of the first polarity.

During the 6-th duration t6, the (4j−1)-th sub-pixel and (4j+2)-th sub-pixel connected to the (4n−2)-th gate line GL4n−2 of the k-th pixel row are discharged with the data voltage corresponding to the (4n−2)-th gate signal G4n−2. The (4j−1)-th sub-pixel of the k-th pixel row connected to the (2m−1)-th data line DL2m−1 is charged according to the (2m−1)-th data signal D2m−1 of the second polarity. The (4j+2)-th sub-pixel of the k-th pixel row connected to the 2m-th data line DL2m is charged according to the 2m-th data signal D2m of the first polarity.

During the 7-th duration t7, the (4j−2)-th sub-pixel and (4j+3)-th sub-pixel connected to the (4n−1)-th gate line GL4n−1 of the k-th pixel row is charged to the data voltage corresponding to the (4n−1)-th gate signal G4n−1. The second sub-pixel of the k-th pixel row connected to the leftmost data line DL0 is charged according to the leftmost data signal D0 of the first polarity. The (4j−2)-th sub-pixel of the k-th pixel row connected to the 2m-th data line DL2m excluding the second sub-pixel is charged according to the 2m-th data signal D2m of the first polarity. The (4j+3)-th sub-pixel of the k-th pixel row connected to the (2m−1)-th data line DL2m−1 is charged according to the (2m−1)-th data signal D2m−1 of the second polarity.

During the eighth duration t8, the (4j−3)-th sub-pixel and (4j+4)-th sub-pixel connected to the 4n-th gate line GL4n of the k-th pixel row are charged with the data voltage corresponding to the 4n-th gate signal G4n. The first sub-pixel of the k-th pixel row connected to the leftmost data line DL0 is charged according to the leftmost data signal D0 of the first polarity. The (4j−3)-th sub-pixel of the k-th pixel row connected to the 2m-th data line DL2m excluding the first sub-pixel is charged according to the 2m-th data signal D2m of the first polarity. The (4j+4)-th sub-pixel of the k-th pixel row connected to the (2m−1)-th data line DL2m−1 is charged according to the (2m−1)-th data signal D2m−1 of the second polarity.

Figure 5:
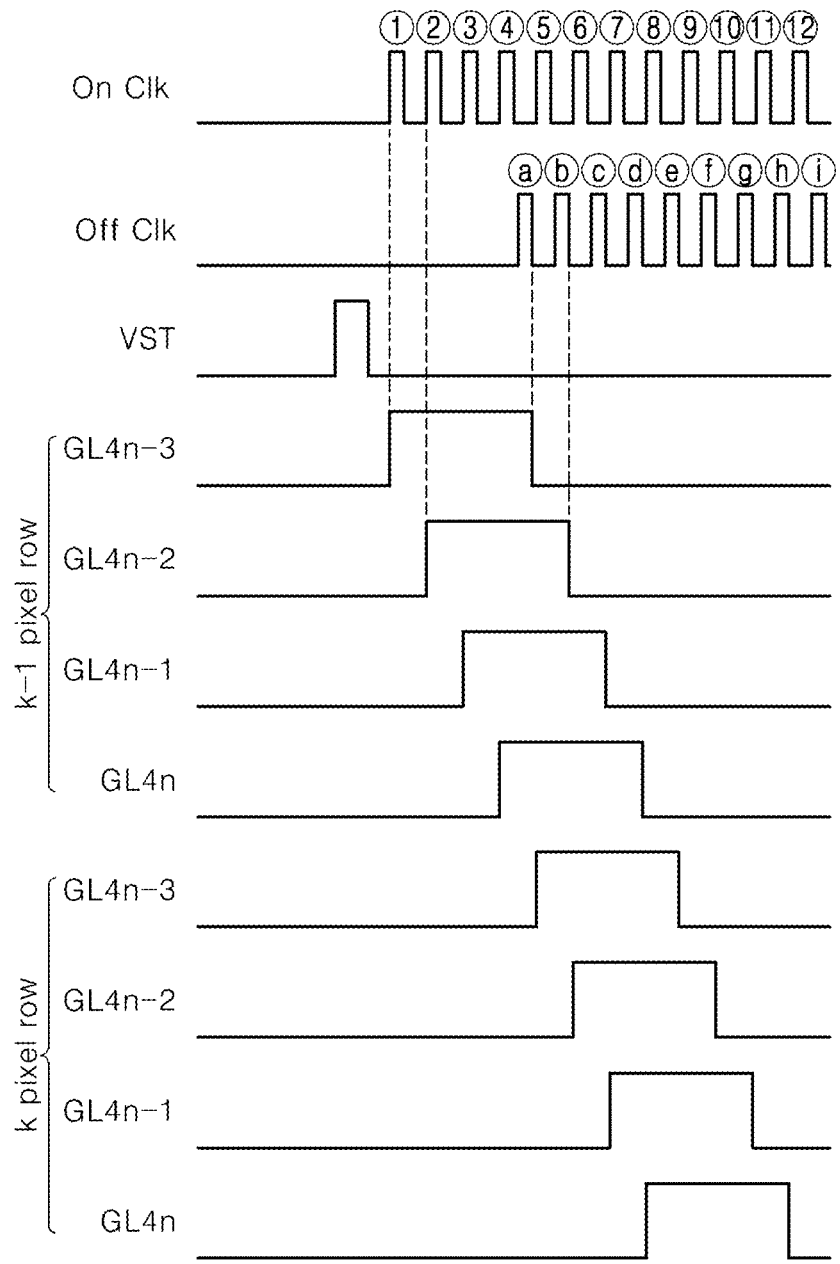
FIG. 5 is a diagram for illustrating a method for generating each of gate signals G1 to G8 in FIG. 4.

FIG. 5 is a diagram for illustrating the generation method of each gate signal G1 to G8 in FIG. 4.

An active time-point and non-active time-point of each of the gate signals G1 to G8 may be determined by an impulse corresponding to an on-clock pulse on-CLK and an impulse corresponding to an off-clock pulse off-CLK corresponding to the on-clock pulse. A specific example thereof will be described with reference to FIG. 5 as follows.

Each of the on-clock pulse on-CLK and the off-clock pulse off-CLK provided from the timing controller TC is composed of a plurality of impulses as periodically outputted. In this connection, the off-clock pulse off-CLK is output later than the on-clock pulse on-CLK.

For example, as shown in FIG. 5, immediately after the generation of a fourth impulse ④ of the on-clock pulse on-CLK, a first impulse ⓐ of the off-clock pulse off-CLK begins to occur. That is, the output time-point of the first impulse ⓐ of the off-clock pulse off-CLK is located between the fourth impulse ④ and the fifth impulse ⑤ of the on-clock pulse on-CLK.

These on-clock pulse on-CLK and off-clock pulse off-CLK generate the gate signals G1 to G8. That is, the active time-point and non-active time-point of each of the gate signals G1 to G8 may be determined by a pair of the on-clock pulse on-CLK and off-clock pulse off-CLK corresponding to each other. In this connection, the active time-point of the signal refers to a time-point at which the signal transitions from a non-active voltage to an active voltage. The non-active time-point of the signal refers to a time-point at which the signal transitions from an active voltage to a non-active voltage. In this connection, when the active voltage corresponds to a high logic voltage and the non-active voltage corresponds to a low logic voltage, the active time-point refers to a rising edge time-point of the corresponding signal while the non-active time-point refers to a falling edge time-point of the signal. On the other hand, when the active voltage corresponds to a low logic voltage and the non-active voltage corresponds to a high logic voltage, the active time-point refer to the falling edge time-point of the corresponding signal, while the non-active time-point refers to the rising edge time-point of the signal. Further, the active duration of the signal means the duration for which the signal remains at the active voltage.

The active time-point and non-active time-point of the first gate signal G1 (an impulse as outputted first) may be determined by the first impulse ① of the on-clock pulse on-CLK, and the first impulse ⓐ of the corresponding off-clock pulse off-CLK as shown in FIG. 5. Specifically, the first gate signal G1 starts to transition to the high logic voltage (active voltage) at the rising edge time-point of the first impulse ① of the on-clock pulse on-CLK. The first gate signal G1 starts to transition to the low logic voltage (non-active voltage) at the falling edge time-point of the first impulse ⓐ of the off-clock pulse off-CLK corresponding to the impulse ①.

In other words, the gate driver generates the first gate signal G1 such that the first gate signal G1 starts to rise to the high logic voltage (active voltage) at the rising edge time-point of the first impulse ① of the on-clock pulse on-CLK and starts to fall to the low logic voltage (non-active voltage) at the falling edge time-point of the first impulse ⓐ of the off-clock pulse off-CLK corresponding to the impulse ①.

In the same manner, the active time-point and non-active time-point of the second gate signal G2 may be determined by the second impulse ② of the on-clock pulse on-CLK, and the second impulse ⓑ of the corresponding off-clock pulse off-CLK as shown in FIG. 5. In the same manner, the active time-point and non-active time-point of the third gate signal G3 may be determined by the third impulse ③ of the on-clock pulse on-CLK, and the third impulse ⓒ of the corresponding off-clock pulse off-CLK as shown in FIG. 5. In the same manner, the active time-point and non-active time-point of the eighth gate signal G8 may be determined by the eighth impulse ⑧ of the on-clock pulse on-CLK, and the eighth impulse ⓗ of the corresponding off-clock pulse off-CLK as shown in FIG. 5.

Each of the first to eighth gate signals G1 to G8 may have a signal width duration corresponding to a duration of 3 horizontal periods to 7 horizontal periods for pre-charging to increase the charge time. The signal width durations of two adjacent gate signals may overlap by one horizontal duration or greater. In one example, a signal width duration of a gate start signal Vst may correspond to two horizontal durations.

However, the present disclosure is not limited thereto. Various modifications are possible without departing from the technical idea of the present disclosure.

Figure 6:
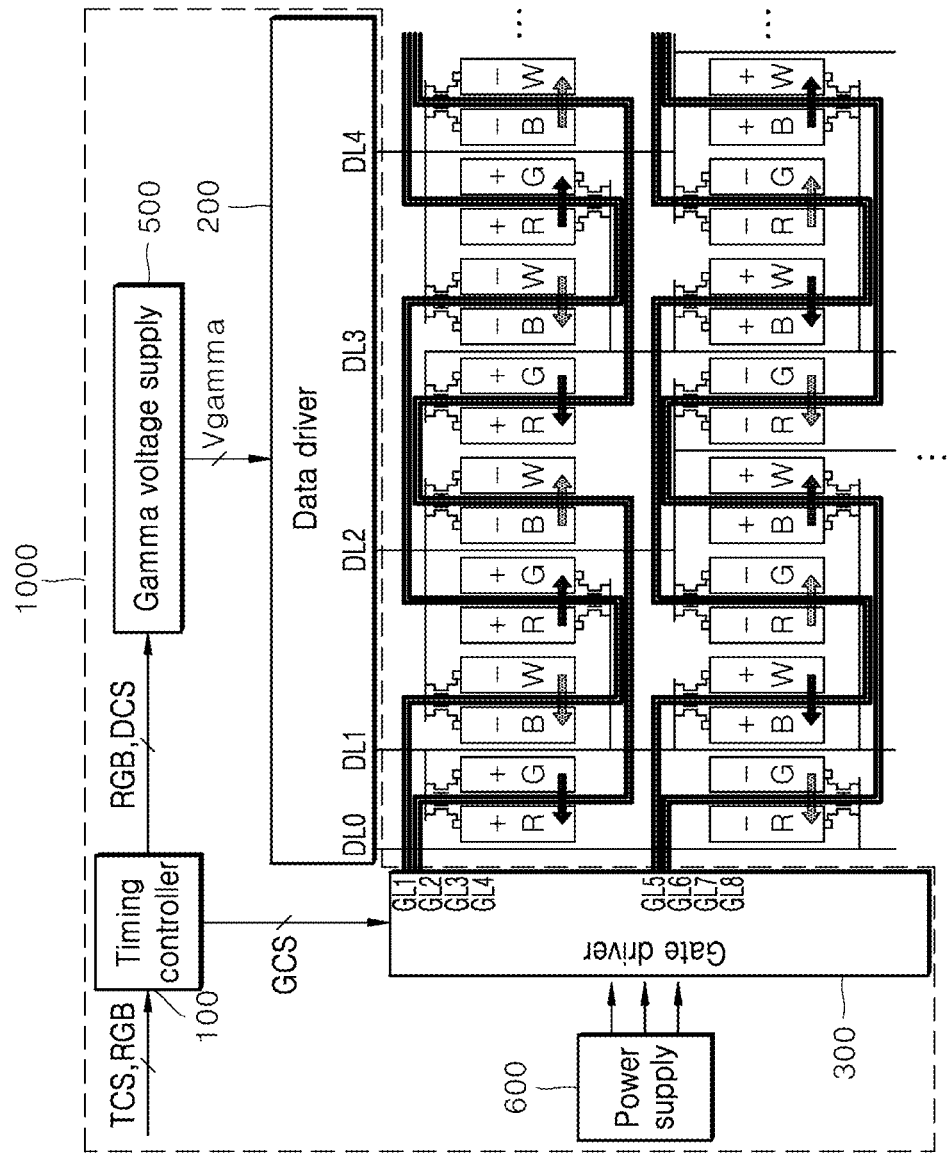
FIG. 6 is a configuration diagram of a QRD Z-inversion-based display device according to another embodiment of the present disclosure.

FIG. 6 is a configuration diagram of a display device to which the QRD-based and Z-inversion-based scheme is applied according to another embodiment according to the present disclosure.

The sub-pixels according to FIG. 6 may be embodied as R, G, B, and W sub-pixels R, G, B, and W that render red, green, blue, and white respectively. The R, G, B, and W sub-pixels R, G, B, and W adjacent to each other in the horizontal direction constitute one pixel P, which is a unit of video display.

In the QRD structure according to the present disclosure, the gate lines GL and the data lines DL are repeatedly arranged on an eight sub-pixels basis. When applying the R, G, B and W sub-pixels R, G, B and W, the four sub-pixels define a single pixel and the same sub-pixel is repeated on a pixel basis. An uniformity of the entire display panel having the R, G, B and W sub-pixels R, G, B and W may be more improved via controlling the display panel on a color sub-pixel basis, compared to the case in which three sub-pixels of R, G, and B sub-pixels R, G, and B define a single pixel.

Figure 7A:
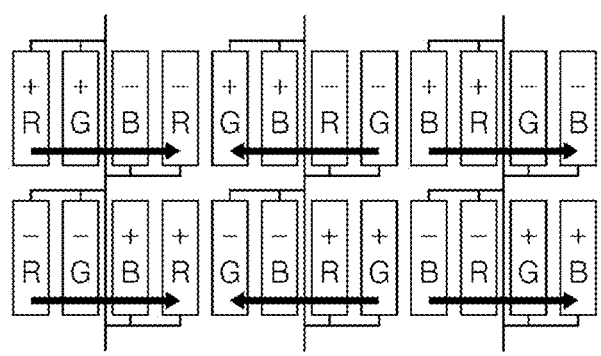
FIGS. 7a and 7b are configuration diagrams of a QRD normal-based display device according to another embodiment of the present disclosure.
Figure 7B:
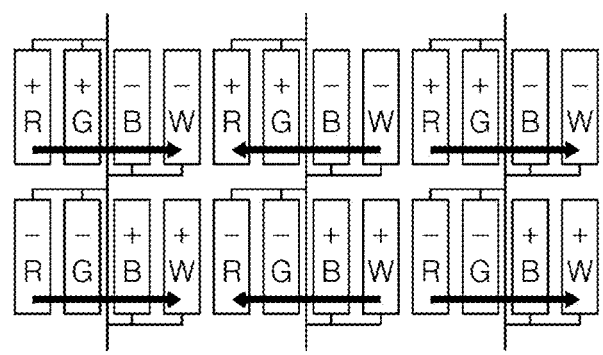

FIGS. 7a and 7b are configuration diagrams of a QRD normal-based display device according to another embodiment of the present disclosure.

FIG. 7a shows a structure for normal inversion according to another embodiment according to the present disclosure. In this connection, R, G, and B sub-pixels R, G, and B that render red, green, and blue respectively may be used. The R, G and B sub-pixels neighboring each other in the horizontal direction constitute a single pixel P which is a unit of video display.

FIG. 7b shows a structure for normal inversion according to another embodiment according to the present disclosure. R, G, B, and W sub-pixels R, G, B, and W that render red, green, blue, and white respectively may be used. The R, G, B, and W sub-pixels R, G, B, and W adjacent to each other in the horizontal direction constitute a single pixel P, which is a unit of video display.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device comprising:
   a plurality of sub-pixels arranged in a pixel row, the sub-pixels rendering R, G, B, and/or W colors;
   a plurality of gate lines, each gate line extending in an alternated and staggered manner between tops and bottoms of the sub-pixels;
   a plurality of data lines extending to intersect the gate lines; and
   a plurality of thin-film transistors, each transistor connecting each of the gate lines and each of the data lines to each sub-pixel,
   wherein four sub-pixels are activated via a single data line and four gate lines.

2. The display device of claim 1, wherein each data line includes:
   a main data line connected to a data driver and extending between adjacent sub-pixels;
   a data supply line branching from the main data line toward a target sub-pixel to receive a data signal therefrom; and
   a data connection line for receiving the data signal from the data supply line and for supplying the data signal to the target sub-pixel.

3. The display device of claim 2, wherein the data supply line has a bent portion such that the sub-pixels have the same area.

4. The display device of claim 3, wherein each thin film transistor includes an oxide thin film transistor.

5. The display device of claim 4, wherein the data connection line has a U-shape and is connected to each thin film transistor, wherein the data signal is applied from the data connection line via the thin film transistor to the target sub-pixel.

6. The display device of claim 5, wherein adjacent R, G, and B sub-pixels define a single pixel, or adjacent R, G, B, and W sub-pixels define a single pixel.

7. The display device of claim 1, wherein a gate line is absent between a $2a$-th sub-pixel and a $(2a+1)$-th sub-pixel, wherein a is an natural number.

8. The display device of claim 1, wherein a data line is absent between a $(b-7)$-th sub-pixel b and a $(b-6)$-th sub-pixel and between a $(b-5)$-th sub-pixel and a b-th sub-pixel, wherein b is a multiple number of 8.

9. The display device of claim 1, wherein a data line or a gate line is absent between a $(c-4)$-th sub-pixel b and a $(c-3)$-th sub-pixel and between a $(c-2)$-th sub-pixel and a $(c-1)$-th sub-pixel, wherein c is a multiple number of 8.

10. The display device of claim 1, wherein the single data line sequentially supplies data signal to four sub-pixels in one frame period.

11. A display device comprising:
    a display panel having a pixel matrix defined by a plurality of gate lines and data lines intersecting each other;
    a data driver configured for supplying a video signal to each data line of the display panel;
    a gate driver configured for driving the gate lines of the display panel; and
    a timing controller configured for aligning video data from an outside and supplying the aligned video data to the data driver, and for generating a data control signal and controlling the data driver using the control signal,
    wherein four sub-pixels are activated via a single data line and four gate lines.

12. The display device of claim 11, wherein the data driver is configured for applying a data voltage of a first polarity to an odd-numbered data line for a N-th frame,
    wherein the data driver is further configured for applying a data voltage of a second polarity to an even-numbered data line for a $(N+1)$-th frame, wherein the second polarity is opposite to the first polarity, and wherein N is an natural number.

13. The display device of claim 12, wherein the device further comprises a power supply configured for supplying a power voltage to the timing controller, data driver and gate driver, and for generating a gate high voltage and a gate low voltage to be supplied to the gate driver.

14. The display device of claim 13, wherein each gate signal is applied to each gate line, wherein gate signals applied to adjacent gate lines respectively have high logic voltage durations overlapping by one horizontal duration or greater.

15. The display device of claim 14, wherein the gate signal is configured be active to a high logic voltage at a rising edge of an on-clock pulse and to be non-active to a low logic voltage at a falling edge of an off-clock pulse.

16. The display device of claim 15, wherein a width of each gate line is smaller than a width of each data line.

17. The display device of claim 11, wherein the single data line sequentially supplies data signal to four sub-pixels in one frame period.

* * * * *